(12) United States Patent
Shiota et al.

(10) Patent No.: US 8,486,588 B2
(45) Date of Patent: *Jul. 16, 2013

(54) OPTICALLY SEMITRANSMISSIVE FILM, PHOTOMASK BLANK AND PHOTOMASK, AND METHOD FOR DESIGNING OPTICALLY SEMITRANSMISSIVE FILM

(75) Inventors: Yuki Shiota, Tokyo (JP); Osamu Nozawa, Tokyo (JP)

(73) Assignee: Hoya Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/340,228

(22) Filed: Dec. 29, 2011

(65) Prior Publication Data

US 2013/0011772 A1 Jan. 10, 2013

Related U.S. Application Data

(60) Continuation of application No. 13/098,096, filed on Apr. 29, 2011, now Pat. No. 8,110,323, which is a continuation of application No. 12/632,103, filed on Dec. 7, 2009, now Pat. No. 7,955,762, which is a division of application No. 11/629,210, filed as application No. PCT/JP2005/010713 on Jun. 10, 2005, now Pat. No. 7,651,823.

(30) Foreign Application Priority Data

Jun. 16, 2004 (JP) .................................. 2004-178895
May 10, 2005 (JP) .................................. 2005-137171

(51) Int. Cl.
G03F 1/00 (2012.01)
G03C 5/00 (2006.01)

(52) U.S. Cl.
USPC ................................ 430/5; 430/311; 430/394

(58) Field of Classification Search
USPC ........................................ 430/5, 311, 394
See application file for complete search history.

(56) References Cited

U.S. PATENT DOCUMENTS

| | | | |
|---|---|---|---|
| 5,538,816 | A | 7/1996 | Hashimoto et al. |
| 5,629,115 | A | 5/1997 | Kawano et al. |
| 5,660,955 | A * | 8/1997 | Han ................................. 430/5 |

(Continued)

FOREIGN PATENT DOCUMENTS

| EP | 1 152 292 A2 | 11/2001 |
|---|---|---|
| EP | 1 365 288 A1 | 11/2003 |

(Continued)

OTHER PUBLICATIONS

English translation of JP 2003-050454 Feb. 2003.*

(Continued)

Primary Examiner — Mark F Huff
Assistant Examiner — Rashid Alam
(74) Attorney, Agent, or Firm — Oliff & Berridge, PLC

(57) ABSTRACT

A photomask blank includes a transparent substrate and a film containing at least two layers having at least a first layer and a second layer formed on the transparent substrate. The first layer is made of a material containing one or more materials selected from the group Ta, Hf, Si, Cr, Ag, Au, Cu, Al, and Mo. The second layer is made of MoSiN, MoSiO, MoSiON, SiN, SiO, or SiON. A phase difference of the film containing at least two layers is from −30° to +30°.

15 Claims, 14 Drawing Sheets

U.S. PATENT DOCUMENTS

| | | | |
|---|---|---|---|
| 5,728,494 A | 3/1998 | Kawano et al. | |
| 5,907,393 A | 5/1999 | Kawano et al. | |
| 6,451,489 B1 | 9/2002 | Kaneko | |
| 6,893,779 B2 | 5/2005 | Kim et al. | |
| 7,955,762 B2 * | 6/2011 | Shiota et al. | 430/5 |
| 2003/0180630 A1 | 9/2003 | Shiota et al. | |
| 2003/0180631 A1 * | 9/2003 | Shiota et al. | 430/5 |

FOREIGN PATENT DOCUMENTS

| | | |
|---|---|---|
| JP | A 06-095363 | 4/1994 |
| JP | A 7-028224 | 1/1995 |
| JP | A 7-239546 | 9/1995 |
| JP | A 8-202016 | 8/1996 |
| JP | A 11-26355 | 1/1999 |
| JP | A 2001-092106 | 4/2001 |
| JP | A 2003-021891 | 1/2003 |
| JP | 2003050454 A * | 2/2003 |
| JP | A 2003-050454 | 2/2003 |
| JP | A-2004-85760 | 3/2004 |
| KR | 2000-0057061 A | 9/2000 |
| KR | 2002-0074546 A | 10/2002 |

OTHER PUBLICATIONS

Rancourt; *Optical Thin Films:* User Handbook; 1996; p. 6; SPIE Optical Engineering Press; Bellingham, Washington.

Supplementary European Search Report dated Dec. 6, 2012 from European Patent Application No. 05749063.3.

Office Action dated Mar. 13, 2013 issued in European Patent Application No. 05749063.3.

* cited by examiner

Fig. 10

| | MATERIAL | REFRACTIVE INDEX n | EXTINCTION COEFFICIENT k | FILM THICKNESS (nm) | PHASE DIFFERENCE (°) | TRANSMISSIVITY (%) |
|---|---|---|---|---|---|---|
| EXAMPLE 1 | CrN | 1.4 | 1.7 | 25 | 0 | 6.9 |
| EXAMPLE 2 | TaHf | 1.6 | 2.1 | 19 | 1 | 9.0 |
| EXAMPLE 3 | Si | 2.0 | 3.4 | 10 | -13 | 7.7 |
| COMPARATIVE EXAMPLE 1 | MoSiN | 2.5 | 0.6 | 11 | 30 | 43.0 |
| COMPARATIVE EXAMPLE 2 | MoSiN | 2.5 | 0.6 | 132 | 360 | 0.4 |

Fig. 12

| | | N CONTENT IN THE FILM (at%) | REFRACTIVE INDEX n | EXTINCTION COEFFICIENT k | FILM THICKNESS (nm) | PHASE DIFFERENCE (°) | TRANSMISSIVITY (%) | REFLECTIVITY (%) |
|---|---|---|---|---|---|---|---|---|
| EXAMPLE 9 | PHASE-DIFFERENCE REDUCTION LAYER | NONE | 1.25 | 2.65 | 14.5 | 8 | 9 | 15 |
| | ANTIREFLECTION LAYER | 57 | 2.39 | 0.60 | 7.8 | | | |
| EXAMPLE 10 | PHASE-DIFFERENCE REDUCTION LAYER | NONE | 1.25 | 2.65 | 14.7 | -5 | 9 | 26 |
| | ANTIREFLECTION LAYER | 57 | 2.39 | 0.60 | 4.8 | | | |
| EXAMPLE 11 | PHASE-DIFFERENCE REDUCTION LAYER | NONE | 1.25 | 2.65 | 13.0 | 17 | 9 | 6 |
| | ANTIREFLECTION LAYER | 57 | 2.39 | 0.60 | 11.5 | | | |
| REFERENCE EXAMPLE 1 | PHASE-DIFFERENCE REDUCTION LAYER | NONE | 1.25 | 2.65 | 16.5 | -17 | 7 | 61 |
| | ANTIREFLECTION LAYER | NONE | | | | | | |
| COMPARATIVE EXAMPLE 3 | PHASE-DIFFERENCE REDUCTION LAYER | TRACE | 2.1 | 1.8 | 19.0 | 54 | 8 | 13 |
| | ANTIREFLECTION LAYER | 57 | 2.39 | 0.60 | 9.0 | | | |

OPTICALLY SEMITRANSMISSIVE FILM, PHOTOMASK BLANK AND PHOTOMASK, AND METHOD FOR DESIGNING OPTICALLY SEMITRANSMISSIVE FILM

CROSS-REFERENCE TO RELATED APPLICATIONS

This application is a continuation of application Ser. No. 13/098,096 filed Apr. 29, 2011, which in turn is a continuation of application Ser. No. 12/632,103 filed Dec. 7, 2009 (now U.S. Pat. No. 7,955,762), which in turn is a divisional of application Ser. No. 11/629,210 filed Jan. 3, 2007 (now U.S. Pat. No. 7,651,823), which in turn is a U.S. national phase of Application No. PCT/JP2005/010713 filed Jun. 10, 2005, which claims priority to Japanese Patent Application 2004-178895 filed Jun. 16, 2004 and Japanese Patent Application 2005-137171 filed May 10, 2005. The disclosure of each of the prior applications is hereby incorporated by reference herein in its entirety.

TECHNICAL FIELD

The present invention relates to an optically semitransmissive film which has a near-zero phase difference, a photomask blank and photomask provided with the optically semitransmissive film, and a method for designing the optically semitransmissive film.

BACKGROUND ART

An optically semitransmissive film in a halftone phase-shift mask is an example of an optically semitransmissive film that partially transmits exposure light and in which the amount of phase shift is controlled.

A phase-shift mask is a photomask used in one type of super-resolution lithography in which photomasks are used in the lithographic step, which is one step in LSI manufacturing. Pattern contrast is improved by an interference effect (hereinafter referred to as the "phase-shift effect") that is brought about by changing by 180° the phase of a portion of the light transmitted through the photomask. A halftone phase-shift mask is one type of phase-shift mask, and exposure light that passes through apertures with a prescribed dimension has an intensity distribution whose spread is greater than the dimensions of the apertures due to diffraction. The optical intensity [of light]*1 in the spread-out portion is cancelled out by the interference effect in which [the light] passes through the adjacent optically semitransmissive areas and interferes with light (interference light) whose phase is shifted by 180°, and the contrast of the boundary area of the two is increased.

Such halftone phase-shift masks are relatively easy to use in the manufacturing process, and are therefore the mainstream phase-shift masks currently used in KrF and ArF lithography. A single-layer thin film composed of Mo—Si—N is generally used as the material of the phase-shift film in a halftone phase-shift mask, the transmissivity is 5 to 15%, and the film thickness is about 60 nm to 100 nm.

A novel phase-shift mask is proposed in Patent Document 1. The mask is used to transfer a pattern that is compatible with a smaller LSI. This phase-shift mask transmits 15% or less of the exposure light and has a light-blocking film (optically semitransmissive film) that has a phase shift of (−30+360×m) degrees or more and (30+360×m) degrees or less (wherein m is an integer) between the light transmission areas. Also disclosed is a phase-shift mask provided with a phase shifter for generating a phase difference of (150+360× m) degrees or more and (210+360×m) or less (wherein m is an integer) in the apertures disposed in the light-blocking film.

Patent Document 1: Japanese Laid-open Patent Application No. 2003-21891

DISCLOSURE OF THE INVENTION

Problems that the Invention is to Solve

In a conventional phase-shift mask, the phase difference $\Delta\theta_0$ between the phase $\theta$ of light that passes through a phase-shift film and the phase $\theta'$ of light that passes through the apertures is proportional to the difference $\Delta L$ in the optical distance between the two transmitted light beams. For example, the following equation is used in the case of a single-layer halftone phase-shift mask, which is currently the mainstream phase-shift mask as described above.

$$\Delta\theta_0 = (360/\lambda) \times \Delta L = (2\pi/\lambda)(nd-d)[rad] \quad \text{(Eq. 1)}$$

In the equation, the refractive index of the atmosphere in which the mask is placed is 1, and n and d are the refractive index and physical film thickness, respectively, of the single-layer film material comprising the phase-shift region. Therefore, for a phase-shift mask in a conventional single-layer halftone phase-shift mask, the design guideline is to set n and d in accordance with the exposure wavelength $\lambda$ so that $\Delta\theta = \pi$, i.e., the following equation holds true.

$$d = \lambda/(2(n-1))| \quad \text{(Eq. 2)}$$

Also, in the case that the phase-shift region is composed of a plurality of material layers, the following equation holds true if the refractive index of each of the materials is n1, n2, ... nj.

$$\Delta\theta_0 = (2\pi/\lambda)(n1+n2+\ldots+nj)d-d)[rad] \quad \text{(Eq. 3)}$$

Eqs. 1 and 3 indicate that a phase-shift difference is being produced by light traveling through the phase-shift region.

However, when an optically semitransmissive film used as the phase-shift mask proposed in Patent Document 1 is designed with the same design philosophy as described above, i.e., with a phase difference of (−30+360×m) degrees or more and (30+360×m) degrees or less (wherein m is an integer), the film thickness d must be reduced in the case that m=0, and a higher transmissivity results. In the particular case of attempting to achieve a phase difference of zero, the film thickness d must be made infinitely close to zero. When m=1, the film thickness becomes considerable, e.g., 100 nm or more, the transmissivity is reduced, and the dimensional accuracy is reduced during etching that is carried out in order to form a master pattern for a phase-shift mask. There is therefore a need for a novel design philosophy in order to design an optically semitransmissive film whose phase shift is close to zero, such as the film disclosed in Patent Document 1.

The present invention was contrived in view of the aforementioned problems, and an object is to provide an optically semitransmissive film that has a nearly zero phase shift, has a desired transmissivity, and is relatively thin, and to provide a method for designing the optically semitransmissive film.

Another object of the present invention is to provide a photomask blank that can be used to manufacture a novel phase-shift mask such as that described in Patent Document 1, for example, by providing an optically semitransmissive film that has a nearly zero phase shift, has a desired transmissivity, and is relatively thin.

Another object of the present invention is to provide a novel phase-shift mask such as that described in Patent Document 1, for example, by using a photomask blank provided with an optically semitransmissive film that has a nearly zero phase shift, has a desired transmissivity, and is relatively thin.

Means of Solving the Problems

In order to solve the aforementioned problems, a first aspect of the present invention provides an optically semitransmissive film which is formed on a translucent substrate and which transmits a portion of light having a desired wavelength $\lambda$, wherein the optically semitransmissive film has a refractive index n and a thickness d that satisfy the expression $0<d\leqq\lambda/(2(n-1))$; and

[the film] has at least one phase-difference reduction layer in which the value $\Delta\theta$ (hereinafter referred to as phase difference $\Delta\theta$ (units: degrees)) obtained by subtracting the phase of light (hereinafter referred to as layer-referenced light) in the absence of a layer from the phase of light (hereinafter referred to as layer-transmitted light) transmitted through a layer is less than the value $\Delta\theta_0=(360/\lambda)\times(n-1)\times d$ (hereinafter referred to as the phase difference $\Delta\theta_0$ (units: degrees)) calculated based on the difference in the optical distance between the layer-transmitted light and the layer-referenced light.

The second aspect of the present invention provides the optically semitransmissive film according to the first aspect wherein the phase-difference reduction layer is used as one medium; another medium is used which is selected from the translucent substrate, another layer, or atmosphere adjacent to the phase-difference reduction layer; and a discontinuous phase change is generated in the boundary between the phase-difference reduction layer and the other medium adjacent to the phase-difference reduction layer, in contrast to the continuous intra-medium phase change in the two media, when light has been transmitted to the optically semitransmissive film having the phase-difference reduction layer, whereby the phase difference $\Delta\theta$ is made less than the phase difference $\Delta\theta_0$.

The third aspect of the present invention provides the optically semitransmissive film according to the first or second aspect wherein the difference between the phase difference $\Delta\theta$ and the phase difference $\Delta\theta_0$ is 10 degrees or more.

The fourth aspect of the present invention provides the optically semitransmissive film according to any of the first to third aspects wherein the phase difference $\Delta\theta$ is a negative value.

The fifth aspect of the present invention provides the optically semitransmissive film according to any of the first to fourth aspects wherein the extinction coefficient k and refractive index n of the material of the phase-difference reduction layer satisfy the expression $k\geqq n$.

The sixth aspect of the present invention provides the optically semitransmissive film according to the fifth aspect wherein the extinction coefficient k of the material of the phase-difference reduction layer is 1.5 or less.

The seventh aspect of the present invention provides an optically semitransmissive film which is formed on a transparent substrate and which transmits a portion of desired exposure light, wherein the optically semitransmissive film has a refractive index n and a thickness d that satisfy the expression $0<d\ \lambda/(2(n-1))$; and

[the film] comprises a multilayer structure having at least one phase-difference reduction layer in which the phase difference $\Delta\theta$ is negative, and at least one other layer that is different than the phase-difference reduction layer.

The eighth aspect of the present invention provides an optically semitransmissive film which is formed on a translucent substrate and which transmits a portion of desired exposure light, wherein the optically semitransmissive film has a refractive index n and a thickness d that satisfy the expression b $0<d\leqq\lambda/(2(n-1))$; [the film] comprises a multilayer structure having at least one phase-difference reduction layer in which the phase difference $\Delta\theta$ is negative, and at least one layer in which the phase difference $\Delta\theta$ is positive; and the phase difference of the entire optically semitransmissive film is a desired phase difference in which the negative phase difference and positive phase difference are canceled out.

The ninth aspect of the present invention provides the optically semitransmissive film according to the seventh or eighth aspect wherein the phase-difference reduction layer is used as one medium; another medium is used which is selected from the translucent substrate, another layer, or atmosphere adjacent to the phase-difference reduction layer; and a discontinuous phase change is generated in the boundary between the phase-difference reduction layer and the other medium adjacent to the phase-difference reduction layer, in contrast to the continuous intra-medium phase change in the two media, when the exposure light has been transmitted to the optically semitransmissive film having the phase-difference reduction layer, whereby the phase difference $\Delta\theta$ is made negative.

The tenth aspect of the present invention provides the semitransmissive film according to any of seventh to ninth aspects, further comprising an antireflective layer as a layer in which the phase difference is positive.

The eleventh aspect of the present invention provides the semitransmissive film according to the tenth aspect wherein the wavelength of the light is a wavelength selected form 150 to 250 nm, and the reflectivity of the optically semitransmissive film is 30% or less with respect to the light having the wavelength.

The twelfth aspect of the present invention provides the semitransmissive film according to any of the seventh to eleventh aspects wherein the extinction coefficient k and refractive index n of the material of the phase-difference reduction layer satisfy the expression $k\geqq n$.

The thirteenth aspect of the present invention provides the semitransmissive film according to the twelfth aspect wherein the extinction coefficient k of the material of the phase-difference reduction layer is 1.5 or less.

The fourteenth aspect of the present invention provides the semitransmissive film according to any of the seventh to thirteenth aspects wherein the extinction coefficient k and refractive index n of the material of the layer having the positive phase difference satisfy the expression k<n.

The fifteenth aspect of the present invention provides the semitransmissive film according to any of the first to fourteenth aspects wherein the phase difference $\Delta\theta$ of the entire optically semitransmissive film is a desired phased difference selected from a range of $-30°$ to $+30°$.

The sixteenth aspect of the present invention provides the semitransmissive film according to any of the first to fifteenth aspects wherein the transmissivity of the optically semitransmissive film is 40% or less.

The seventeenth aspect of the present invention provides the semitransmissive film according to any of the first to fifteenth aspects wherein the transmissivity of the optically semitransmissive film is 15% or less.

The eighteenth aspect of the present invention provides the semitransmissive film according to any of the first to seventeenth aspects wherein the thickness of the optically semitransmissive film is in a range of 1 to 50 nm.

The nineteenth aspect of the present invention provides a photomask blank for manufacturing a photomask having a mask pattern comprising an optically semitransmissive film which is formed on a translucent substrate and which partially transmits desired exposure light, wherein the optically semitransmissive film according any of the first to eighteenth aspects is used as the optically semitransmissive film.

The twentieth aspect of the present invention provides the photomask blank according to the nineteenth aspect wherein a light-blocking film is formed on the optically semitransmissive film.

The twenty-first aspect of the present invention provides the photomask blank according to the twentieth aspect wherein the optically semitransmissive film comprises a material containing Si, or Mo and Si; and the light-blocking film comprises a material containing Cr.

The twenty-second aspect of the present invention provides a photomask comprising an optically semitransmissive area in which the optically semitransmissive film in the photomask blank according to any of nineteenth to twenty-first aspects is etched in a desired pattern.

The twenty-third aspect of the present invention provides a method for designing an optically semitransmissive film which is formed on a translucent substrate and which transmits a portion of light having a desired wavelength $\lambda$, the method comprising:

providing a phase-difference reduction layer that has a refractive index n and a thickness d that satisfy the expression $0<d\leq\lambda/(2(n-1))$;

taking into account a discontinuous negative phase change generated in the boundary between the phase-difference reduction layer and a medium selected from the translucent substrate, another layer, or atmosphere adjacent to the phase-difference reduction layer when light has passed through the optically semitransmissive film; and adjusting the thickness of the phase-difference reduction layer and designing an optically semitransmissive film so that the phase difference of the phase-difference reduction layer is a desired phase difference.

The twenty-fourth aspect of the present invention provides the method for designing an optically semitransmissive film according to the twenty-third aspect wherein the desired phase difference of the phase-difference reduction layer is set so that the phase difference of the entire optically semitransmissive film is in a range of −30° to +30°.

The twenty-fifth aspect of the present invention provides the method for designing an optically semitransmissive film according to the twenty-third or twenty-fourth aspect wherein the phase-difference reduction layer is selected from materials in which the extinction coefficient k and the refractive index n satisfy the expression $k\geq n$.

Effect of the Invention

In accordance with the present invention, the optically semitransmissive film has a refractive index n and a thickness d that satisfy the expression $0<d\leq\lambda/(2(n-1))$, and at least one phase-difference reduction layer is provided in which the value $\Delta\theta$ is less than the value $\Delta\theta_0$ calculated based on the difference in the optical distance, making it possible to obtain an optically semitransmissive film that has a nearly zero phase shift, has a desired transmissivity, and is relatively thin.

In accordance with the present invention, a photomask blank can be obtained that can [be used to] manufacture a novel phase-shift mask as described in Patent Document 1, for example, by using a photomask blank provided with the optically semitransmissive film.

In accordance with the present invention, a novel phase shift photomask such as that described in Patent Document 1, for example, can be obtained in actual practice by manufacturing a photomask using the above-described photomask blank.

BEST MODE FOR CARRYING OUT THE INVENTION

The optically semitransmissive film according to the present embodiment is formed on a translucent substrate, transmits a portion of light having a desired wavelength $\lambda$, has a function for shifting the phase of the transmitted light by a prescribed amount, and is used in a phase-shift mask and a phase-shift mask blank, which is the material of the phase-shift mask. The optically semitransmissive film comprises a phase-difference reduction layer that has the functions described below. Following is a description of the optically semitransmissive film according to the present invention, with focus placed on the phase-difference reduction layer.

First, the phase-difference reduction layer has one or more layers having a refractive index n and a thickness d that satisfy the expression $0<d\leq\lambda/(2(n-1))$. The value $\Delta\theta$ (hereinafter referred to as phase difference $\Delta\theta$ (units: degrees)) obtained by subtracting the phase of light (hereinafter referred to as layer-referenced light) in the absence of a layer from the phase of light (hereinafter referred to as layer-transmitted light) transmitted through a layer is less than the value $\Delta\theta_0 = (360/\lambda)\times(n-1)\times d$ (hereinafter referred to as the phase difference $\Delta\theta_0$ (units: degrees)) calculated based on the difference in the optical distance between the layer-transmitted light and the layer-referenced light, i.e., less than the value calculated using Eq. 1 described above. The thickness d is made to be equal to or less than the thickness indicated in Eq. 2 described above, in which the conventional phase difference is 180°. In this film-thickness region, a discontinuous phase difference produced when light passes through the boundary of two media is used in the present embodiment in order to obtain a phase difference that is still less than the phase difference $\Delta\theta_0$ calculated in Eq. 1. This discontinuous phase change occurs when at least one of the two media is not transparent with respect to the transmitted light.

FIG. 1 is a diagram schematically showing an example of the phase change of light that advances through two media. FIG. 1A shows a case in which the media 1 and 2 are both transparent, and FIG. 1B shows a case in which the medium 1 is transparent and the medium 2 is opaque. When the media 1 and 2 are both transparent, the phase change is continuous within the two media and at the boundary between the two media, as shown in FIG. 1A. When the medium 2 is opaque, a discontinuous phase difference is generated at the boundary between the media, as shown in FIG. 1B. The case in which the phase is delayed due to a discontinuous phase change is referred to as a negative phase change, as shown in FIG. 1B.

The reason that the above-described discontinuous phase change occurs is described in detail below.

Considered first is the process in which light is reflected at or passes through the boundary between two medium, as shown in FIG. 2. The complex refractive index of the medium 1 is expressed as $N_1=n_1-ik_1$; the complex refractive index of the medium 2 is expressed as $N_2=n_2-ik_2$; the amplitude of the reflected light r at the boundary of the media 1 and 2 is $A_r>0$, and the phase is $\Phi_r$; and the amplitude of the transmitted light t at the boundary of the media 1 and 2 is $A_t>0$, and the phase is $\Phi_t$. In the above expressions, the refractive index of the medium 1 is $n_1$, the extinction coefficient of the medium is $k_1$, the refractive index of the medium 2 is $n_2$, and the extinction coefficient of the medium is $k_3$ (*2). When the light that enters from the medium 1 into the medium 2 at the boundary 1-2 has an amplitude of 1 and a phase of 0, the following expressions hold true for vertical incidence, based on Fresnel laws.

$$r = A_r \exp(-\Phi_r) = A_r(\cos \Phi_r - i \sin \Phi_r) = (N1-N2)/(N1+N2) \quad \text{(Eq. 4)}$$

$$t = A_t \exp(-\Phi_t) = A_t(\cos \Phi_t - i \sin \Phi_t) = 2N1/(N1+N2) \quad \text{(Eq. 5)}$$

When the media 1 and 2 are both transparent media, i.e., when $k_1 = k_2 = 0$, the reflected light r and transmitted light t are real numbers. Therefore, the following hold true based on Eqs. 4 and 5.

$$\sin \Phi_r \sin \Phi_t = 0$$

$$A_r \cos \Phi_r = (n_1 - n_2)/(n_1 + n_2) \to \Phi_r = \pi, \pi (n_1 < n_2) 0 (n_1 > n_2)$$

$$A_t \cos \Phi_t 2n_1/(n_1 + n_2) > \to \Phi_t = 0$$

Since the phases of the incident light and the transmitted light are the same, a discontinuous phase change does not occur at the boundary when light passes through the boundary of the media 1 and 2. However, the reflected light r and the transmitted light t are complex numbers when one of the two media 1 and 2 is an absorbing medium. Therefore, $\sin \Phi_t$ does not become 0, and a discontinuous phase change occurs at the boundary when light passes through the boundary of the media 1 and 2.

FIG. 3A shows a case in which the refractive index $n_1$ and extinction coefficient $k_1$ of the medium 1 are set t be 1 and 0 (air or vacuum), respectively, and, based on Eq. 2, the phase change $\Phi_t$ of the light that passes from the medium 1 to the medium 2 is calculated and the contour lines are plotted when the refractive index $n_2$ and the extinction coefficient $k_2$ of the medium 2 are varied (the horizontal axis represents the refractive index n, and the vertical axis represents the extinction coefficient k). Based on the same theory, FIG. 3B shows the phase change $\Phi_t'$ when light passes from the medium 2 to the medium 1 (the horizontal axis represents the refractive index n, and the vertical axis represents the extinction coefficient k).

It is apparent from FIGS. 3A and 3B that the phase of light changes in a discontinuous manner by being reflected or transmitted at the boundary between the two media. Specifically, a negative phase change occurs in the region in which the extinction coefficient k is k>0 when light passes from the medium 1 to the medium 2, a positive phase change occurs in the region in which the extinction coefficient k is k>0 when light passes from the medium 2 to the medium 1, the change of phase at the boundary of the media 1 and 2 depends not only on the refractive index n, but also on the extinction coefficient k, and the medium having a smaller refractive index n and a larger extinction coefficient k causes a negative phase change that increases negativity at the boundary when light passes from the medium 1 to the medium 2.

In the present embodiment, when the optically semitransmissive film has a single phase-difference reduction layer, the medium 1 can be made to correspond to a translucent substrate, and the medium 2 can be made to correspond to a phase-difference reduction layer.

With any material that constitutes a phase shift region that corresponds to the medium 2 in a conventional half-tone phase-shift mask, the extinction coefficient k at the exposure wavelength is substantially lower than the refractive index n and is close to 0. This results in a low value for the negative phase change at the boundary with the translucent substrate that corresponds to the medium 1, or a low positive phase change at the boundary with the atmosphere (air), and a continuous phase change such as that shown in FIG. 1A can be presumed to occur. On the other hand, with an absorbing material in which the extinction coefficient k is considerable, at about n≦k, relative to the refractive index n, consideration must be given both to the discontinuous phase change at the boundary and to the conventional phase difference shown in Eqs. 1 and 3.

The phase $\theta_t$ of the layer-transmitted light t of the phase-difference reduction layer, and the phase $\theta_t'$ of the layer-referenced light t' can be calculated when a phase-difference reduction layer having a complex refractive index $N = n - ik$ is layered to a thickness d on a portion of a translucent substrate, and light having a wavelength λ is made vertically incident from the reverse (the surface with no phase-difference reduction layer) side of the substrate, as shown in FIG. 4. The transmitted light t and t' are expressed in the following manner when the complex refractive index of the atmosphere is set to be 1−0i, the complex refractive index of the translucent substrate is set to be $N_s = n_s - 0i$, and consideration is given to multiple reflections of the light in the medium in addition to the aforementioned Fresnel laws.

$$t = (t_s \times t_1 \times \exp(-i\delta))(1 r_s \times r_1 \times \exp(-2i\delta)) \quad \text{(Eq. 6)}$$

$$t' = 2n_s/(n_s+1)\exp(-i\delta')| \quad \text{(Eq. 7)}$$

In the equations, $$t_s = 2n_s/(n_s+N) t_1 = 2N/(N+1)$$

$$r_s = (n_s-N)/(n_s+N) r_1 = (n_s-1)/(n_s+1)$$

$$\delta = (2\pi/\lambda)Nd, \text{ and}$$

$$\delta' = (2\pi/\lambda)d|.$$

As used herein, the term "phase $\theta_t$'" corresponds to δ'. Also, the phase $\theta O_t$ is calculated by rewriting Eq. 6 as t=Aexp (−ix) and using $x = \theta_t$ (where A is a real arithmetic constant).

FIG. 5 is a graph obtained by plotting, as a function of the phase difference $\Delta\theta_t = (\theta_t - \theta_t')$ for the cases in which k=0.6 (dotted line), k=2.0 (alternate long and short dash line), and k=2.5 (dashed line), wherein $n_s$, n, and λ in FIG. 4 are $n_s = 1.56$, n=2.0, and λ=193.4 (nm). The graph also shows (solid line) the relationship between the thickness d and the phase difference Δθn obtained from Eq. 1 for calculating the phase difference in a conventional single-layer phase-shift mask.

It is apparent from FIG. 5 that the relationship between the thickness and the phase difference of a film in which k=0.6, i.e., the extinction coefficient k is less than the refractive index n, is similar to the relationship in the Eq. 1. The case of a film in which k=2.0 and k=2.5, i.e., an absorbing film, considerably diverges from the relationship in Eq. 1, and the phase difference is reduced. A film thickness region is produced in which Δθ<0 when n<k=2.5. This is due to the effect of the negative phase change produced at the boundary between the translucent substrate and the phase-difference reduction layer due to the fact that the extinction coefficient k is greater than the refractive index n.

Thus, the phase-difference reduction layer in the optically semitransmissive film of present embodiment comprises an absorbing film, i.e., an absorbing material in which the extinction coefficient k is relatively large. Therefore, a discontinuous negative phase change occurs at the boundary with the medium selected from the translucent substrate, another layer, or atmosphere adjacent to the phase-difference reduction layer, and the negative phase change sufficiently small to be ignored in conventional practice can be increased in the boundary between the substrate and the optically semitransmissive film. As a result, the phase difference $\Delta\theta$ can be made less than the phase difference $\Delta\theta_0$ calculated using Eq. 1, and it is possible to obtain a phase-difference reduction layer that has a phase difference $\Delta\theta$ in the vicinity of 0°, e.g., a phase difference $\Delta\theta$ that is 0±30°, while having a limited thickness (in practice, 1 nm or more, for example). Also, if the negative phase change is increased, an optically semitransmissive film (phase-difference reduction layer) can be formed in which the phase difference $\Delta\theta$ is exactly 0° or is a negative value in a film thickness region that is less than the thickness at which the phase difference $\Delta\theta_0$ is $\Delta\theta=180°$ as calculated using Eq. 2. In the present embodiment, the phrase "phase difference $\Delta\theta_0$ having a negative value" refers a case in which the phase difference is a negative value when expressed in the range of ±180°. In such a case, a phase difference of 360 degrees is expressed as 0 degrees.

In the present embodiment, the thickness of the phase-difference reduction layer is not adjusted based on Eq. 1, but rather the relationship between the phase difference and the thickness as shown in FIG. 5, for example, is calculated in advance using Eqs. 6 and 7; and the thickness is set so that a desired phase difference can be obtained. In particular, a case can be considered in which the thickness d and the phase difference $\Delta\theta$ are varied so that k=2.0 and k=2.5, and a material is used for which the relationship is such that the phase difference sequentially changes from $\Delta\theta<0$ to $\Delta\theta=0$ to $\Delta\theta>0$ with increased film thickness from the point at which $\Delta\theta=0$ at d=0, as shown in FIG. 5. In this case, a zero point through which the phase change passes when changing from negative to positive can be selected as the phase difference, making it possible to obtain a phase-difference reduction layer in which the phase difference is exactly zero. The transmissivity can be adjusted by selecting a thickness that allows the phase difference to be adjusted in the ranges of 0±30°, 0±10°, 0±5°, and the like, based on the balance between the allowable phase difference and the transmissivity required in the phase-difference reduction layer.

The transmissivity and phase difference of the optically semitransmissive film are suitably determined by design in accordance with the intended application of the optically semitransmissive film. In other words, a film material having a desired extinction coefficient k and a desired refractive index n can be selected so that the film thickness satisfies the required value of the transmissivity and the required value of the phase difference in accordance with the intended application. Foreseeing variations in the transmissivity and phase difference that accompany washing, heat treatment, and other treatments of the optically semitransmissive film, the film may be designed so that the transmissivity and phase difference are different than the transmissivity and phase difference that are originally required when the optically semitransmissive film is formed. The balance between the transmissivity variation and reflectivity variation that accompany washing, heat treatment, and other treatments of the optically semitransmissive film can be used to ensure that the transmissivity substantially does not vary even when washing, heat treatment, and other treatments are carried out, or to control the variation in the transmissivity caused by the aforementioned washing, heat treatment, and other treatments.

As the difference between the phase difference $\Delta\theta$ and the phase difference $\Delta\theta_0$ increases above 10 degrees or more, for example, the relationship between the film thickness and the phase difference $\Delta\theta$ begins to form a broad curve, and the transmissivity, which varies depending on the film thickness, can be more easily adjusted. When the phase-difference reduction layer is a single-layer optically semitransmissive film, the phase difference and transmissivity of the optically semitransmissive film can be adjusted by adjusting the phase difference and transmissivity of the phase-difference reduction layer.

The optically semitransmissive film is not limited to being provided with a single phase-difference reduction layer, but may be provided with two or more phase-difference reduction layers (same or different characteristics), or may be multilayered in combination with other layers.

An example of a multilayered-optically semitransmissive film is an optically semitransmissive film having a multilayered structure comprising at least one phase-difference reduction layer in which the phase difference is negative and at least one layer in which the phase difference is positive, and in which the phase difference of the entire optically semitransmissive film is a desired phase difference wherein the negative phase difference and the positive phase difference cancel out each other.

When, for example, the reflectivity of the exposure light is high only in the phase-difference reduction layer, an antireflection layer can be disposed on the phase-difference reduction layer. Specifically, the phase difference is positive because an antireflection film cannot ordinarily sufficiently demonstrate [antireflective] function if the material does not have a low extinction coefficient. Therefore, the phase difference in the phase-difference reduction layer is negative, and the phase difference of the antireflective layer having a positive phase difference cancel out each other, whereby the phase difference of the entire optically semitransmissive film can be adjusted to near zero.

A relatively thin optically semitransmissive film can be obtained in accordance with the present embodiment. The phase-difference reduction layer preferably has a thickness selected from a range of 1 to 50 nm, and more preferably 1 to 30 nm. The thickness of the entire optically semitransmissive film is also preferably 1 to 50 nm, and more preferably 1 to 30 nm. Thus, by making the film relatively thin, a pattern with very small dimensions can be processed when a photomask is used or when other processes are carried out in which a pattern must be formed on an optically semitransmissive film.

Following is a description of the photomask blank and the photomask of the present embodiment.

The photomask blank of the present embodiment may, for example, be used for obtaining the photomask described in Patent Document 1.

The photomask 1 described in Patent Document 1 is one in which a phase difference of 180° is provided to the aperture 3 disposed in the light-blocking portion (optically semitransmissive area) by cutting a translucent substrate 4 as a phase shifter, as shown in FIG. 6, and in which the phase difference has been adjusted to 0±30° and the transmissivity has been adjusted to 15% or less by using the optically semitransmissive film 22 (FIG. 7) of the present embodiment as the light-blocking portion 2. Therefore, the photomask 10 of the present embodiment has a structure in which the annular diaphragm 22 is disposed on the translucent substrate 4, as shown in FIG. 7.

The method shown in FIG. 8 is an example of a method for manufacturing the photomask.

Specifically, a resist film 11 is formed on a photomask blank 10, and a pattern is drawn on the resist film 11 using an electron beam or laser (FIG. 8A). Next, the resist film 11 is developed, the optically semitransmissive film 22 is etched, and the translucent substrate 4 is etched down to a depth that produces a phase difference of 180° (FIG. 8B). The resist film 11 is subsequently peeled away (FIG. 8C). Next, a resist film 12 is coated over the entire surface, and a pattern is drawn using electron beam lithography (FIG. 8D). The resist film 12 is subsequently developed, and the optically semitransmissive film 22 is etched (FIG. 8E). Lastly, the resist film 12 is peeled away (FIG. 8F) to obtain a photomask 1 having a light-blocking portion 2 (optically semitransmissive area).

Also, the photomask 1 of the present embodiment can be used as a photomask having a light-blocking band. The light-blocking band is a light-blocking film composed of a chromium-based material, for example, formed on at least the peripheral portion of the pattern region, and is provided to prevent the occurrence of transfer pattern defects produced by transmitted light in the peripheral portion of the pattern region during photomask use.

FIG. 9 is a diagram showing an example of the steps for manufacturing the photomask having a light-blocking band.

First, a light-blocking film 13 is formed on the photomask blank 10 shown in FIG. 7, a resist film 11 is formed on the light-blocking film, and a pattern is drawn using an electron beam or a laser (FIG. 9A). Next, the resist film 11 is developed, the light-blocking film 13 is etched, the optically semitransmissive film 22 is etched, and the translucent substrate 4 is etched down to a depth that produces a phase difference of 180° (FIG. 9B). The resist film 11 is subsequently peeled away (FIG. 9C). Next, a resist film 12 is coated over the entire surface (FIG. 9D), and a pattern is drawn using electron beam lithography. The resist film 12 is subsequently developed, the light-blocking film 13 is etched, and the optically semitransmissive film 22 is etched (FIG. 9E). Next, the resist film 12 is removed (FIG. 9F), a resist film 14 is again coated over the entire surface (FIG. 9G), a resist pattern is formed to leave only a region in which the light-blocking band is formed (FIG. 9h), the chromium in the transfer region I is thereafter etched (FIG. 9i), and the remaining resist film 14 is peeled away (FIG. 9h) to obtain a photomask 15 having a light-blocking band 33 (FIG. 9j).

No limitations are imposed by the pattern arrangement on the photomask 1 and the manufacturing steps described above. In the manufacturing steps, for example, rather than etching down the translucent substrate 4 and thereafter forming a light-blocking portion 2 composed of an optically semitransmissive film 22 as described above, the light-blocking portion 2 composed of the optically semitransmissive film 22 may be formed and the translucent substrate 4 etched thereafter.

Also, the phase shifter formed in the aperture 3 may be a film that causes phase shifting. In such a case, the photomask blank 10 would be one in which a phase-shifting film is disposed on the optically semitransmissive film 22 or between the translucent substrate 4 and the optically semitransmissive film 22.

The optically semitransmissive film 22 may comprise a single-layer film or a film having two or more layers. In the case of two or more layers, at least one of the layers can be a phase-difference reduction layer that produces a negative phase change at the boundary. When the reflectivity of the exposure light is high with only a phase-difference reduction layer, an antireflective layer can be disposed on the phase-difference reduction layer. In other words, the phase difference is usually positive because the antireflective film is incapable of adequately demonstrating an antireflective function if it is not made of a material having a low extinction coefficient. Therefore, the phase difference in the phase-difference reduction layer is set to be negative so as to cancel out the phase difference of the antireflective film, which has a positive phase difference, whereby an antireflective function can be provided and the phase difference of the entire optically semitransmissive film can be adjusted to near zero. The antireflective film may be disposed on the phase-difference reduction layer (the side on which the surface of the photomask blank is present) when lower surface reflectivity is desired in the photomask blank. The antireflective film may be disposed below the phase-difference reduction layer (between the translucent substrate and the phase-difference reduction layer) when lower reflectivity is desired in the reverse surface, and the antireflective film may be disposed on both sides of the phase-difference reduction layer when lower reflectivity is desired in both the surface and the reverse side. The reflectivity is adjusted by designing the film so as to obtain a reflectivity that is equal to or less than the allowable value at the desired wavelength in the desired surface within a range in which adjustment can be made with consideration given to the phase difference and transmissivity in the case of a single layer or multiple layers.

The optically semitransmissive film 22 may be a film that has been heat-treated at about 150 to 500° C., for example, or more preferably about 250 to 500° C.; treated by UV or laser radiation; or treated in another manner in order to prevent variability in the characteristics due heat processing or other processing after film formation, or to prevent variability in the optical properties caused by washing or another chemical treatment.

When the optically semitransmissive film 22 of the present embodiment is used as a photomask blank 10, the optical characteristics (transmissivity, reflectivity, and phase difference) must be matched to the exposure wavelength of the exposure device in which the photomask 1 is to be used. The exposure wavelength of the photomask 1 is preferably one in which consideration is given to exposure wavelengths in the range of 150 nm to 250 nm, which includes KrF excimer laser light (wavelength: 248 nm), ArF excimer laser light (wavelength: 193 nm), and $F_2$ excimer laser light (wavelength: 157 nm). Particularly preferred is an exposure wavelength in which consideration is given to exposure wavelengths in the range of 150 nm to 200 nm, which includes ArF excimer laser light (wavelength: 193 nm) and $F_2$ excimer laser light (wavelength: 157 nm). These are next-generation exposure wavelengths. Also, the reflectivity of the surface (the film surface side) of the photomask blank is preferably kept to 30% or less at the exposure wavelength. The reflectivity is also preferably kept to 30% or less on the reverse side of the photomask blank. The reflectivity is preferably kept to about 40% or less at the scanning wavelength of the photomask 1 and photomask blank 10. Examples of scanning wavelengths include 257 nm, 266 nm, 364 nm, 488 nm, and 633 nm.

Other factors must also be considered, such as resistance to the washing fluid, pattern workability, and other characteristics of the optically semitransmissive film 22.

EXAMPLES

The present invention is described in further detail below using the photomask blank and photomask as examples and comparative examples.

Example 1

An optically semitransmissive film provided with a single phase-difference reduction layer composed of chromium nitride was formed on a translucent substrate composed of synthetic quartz glass to obtain a photomask blank having the structure shown in FIG. 7. Specifically, an optically semitransmissive film was formed by sputtering a chromium target onto a translucent substrate in an atmosphere of argon and nitrogen.

The table in FIG. 10 shows the transmissivity and phase difference of an optically semitransmissive film at an ArF excimer laser wavelength of 193 nm, which is the exposure wavelength maintained when a photomask is used. The transmissivity was measured using a spectrophotometer, and the phase difference was measured using a phase difference measuring device (MPM-193, manufactured by Lasertec). In the present example, the transmissivity was kept within a range of 5 to 15%.

In the present example, the transmissivity was kept within a range of 5 to 15% while keeping the phase difference near zero by using a relatively thin film.

Example 2

An optically semitransmissive film provided with a single phase-difference reduction layer composed of tantalum hafnium was formed on a translucent substrate composed of synthetic quartz glass to obtain the photomask blank shown in FIG. 7. Specifically, an optically semitransmissive film was formed by sputtering a tantalum hafnium (Ta:Hf=8:2) target onto a translucent substrate in an argon atmosphere.

The table in FIG. 10 shows the results of measuring the transmissivity and phase difference of an optically semitransmissive film at an ArF excimer laser wavelength of 193 nm, which is the exposure wavelength maintained when a photomask is used. The same measuring means as used in example 1 were employed. In the present example, the transmissivity was kept within a range of 5 to 15%.

In the present example, the transmissivity was kept within a range of 5 to 15% while keeping the phase difference near zero by using a relatively thin film.

Example 3

An optically semitransmissive film provided with a single phase-difference reduction layer composed of silicon was formed on a translucent substrate composed of synthetic quartz glass to obtain a photomask blank shown in FIG. 7. Specifically, an optically semitransmissive film was formed by sputtering a silicon target onto a translucent substrate in an argon atmosphere.

The table in FIG. 10 shows the results of measuring the transmissivity and phase difference of an optically semitransmissive film at an ArF excimer laser wavelength of 193 nm of, which is the exposure wavelength maintained when a photomask is used. The same measuring means as used in example 1 were employed. In the present example, the transmissivity was kept within a range of 5 to 15%.

In the present example, the transmissivity was kept within a range of 5 to 15% while keeping the phase difference near zero by using a relatively thin film.

Comparative Examples 1 and 2

An optically semitransmissive film having a MoSin film as the optically semitransmissive portion was formed on a conventional halftone phase-shift mask on a translucent substrate composed of synthetic quartz glass to obtain the photomask blank shown in FIG. 7. Specifically, an optically semitransmissive film was formed by sputtering a mixed target composed of Mo and Si (Mo:Si=1:9 atomic ratio) in an atmosphere composed of argon and nitrogen.

A MoSin [film] does not have a thickness region in which the phase difference is 0° or less in a region below the minimal thickness at which the phase difference is 180°. Therefore, in comparative example 1, the phase difference was kept very small in a region of relatively small film thicknesses, but the transmissivity was still excessively high. In comparative example 2, the thickness was adjusted to give the phase difference a zero limit. However, the optically semitransmissive portion was very thick at 100 nm or more, and the film was not suitable for micropatterning.

Examples 4 to 6

The photomask blanks of examples 1 to 3 were used to form photomasks in accordance with the steps shown in FIG. 8 described above.

The optically semitransmissive film Cr—N of example 1 was dry etched using $Cl_2+O_2$ as etching gas, the TaHf of example 2 was dry etched using $Cl_2$ gas, and the Si of example 3 was dry etched using $CF_4$ gas. The translucent substrate was dry etched using $CF_4+O_2$ as etching gas. The translucent substrate had sufficient resistance to the etching of the optically semitransmissive film.

In the photomasks of examples 4 to 6, which correspond to examples 1 to 3, a good pattern shape was obtained with low dimensional error in micropatterning.

Examples 7 and 8

The present examples involve manufacturing photomasks having a light-blocking band by using the photomask blanks of examples 2 and 3.

The photomasks were formed in accordance with the steps in FIG. 9 by using the photomask blanks of examples 2 and 3. A chromium-based film was used as the light-blocking film for the light-blocking band, and the film was dry etched using $Cl_4+O_2$ as etching gas. The etching of examples 2 and 3 was carried out in the same manner as in examples 5 and 6. Selective etching was possible because the optically semitransmissive film and light-blocking film both had good etching selectivity, and a good pattern shape was obtained with low dimensional error by etching the optically semitransmissive film using the light-blocking film as a mask.

The same chromium material as that of the light-blocking material for the light-blocking band was used as the optically semitransmissive film material, and it was therefore difficult to selectively etch the photomask blank of example 1.

Examples 9 to 11

A phase-difference reduction layer 16 composed of molybdenum and silicon, and an antireflective layer 17 composed of molybdenum, silicon, and nitrogen were layered on a translucent substrate 4 composed of synthetic quartz glass to form an optically semitransmissive film 22, as shown in FIG. 11, and a photomask blank 18 was obtained. Specifically, a phase-difference reduction layer 16 was formed by sputtering a target composed of molybdenum and silicon (Mo:Si=1:9 atomic ratio) onto a translucent substrate 4 in an atmosphere of argon or another inert gas. Molybdenum and silicon (Mo:Si=1:9 atomic ratio) were subsequently sputtered in an atmosphere containing argon and nitrogen to form an antireflective layer 17 composed of MoSiN, whereby a two-layer optically semitransmissive film 22 was formed.

The table in FIG. 12 shows the film characteristics of the examples 9 to 11. The refractive index, extinction coefficient, transmissivity, reflectivity, and phase difference are the values observed at an ArF excimer laser wavelength of 193 nm, which is the exposure wavelength maintained when a photomask is used. The transmissivity and reflectivity were measured using a spectrophotometer, and the phase difference was measured using a phase difference measuring device (MPM-193, manufactured by Lasertec). In the present example, the transmissivity was kept within a range of 5 to 15%.

FIG. 13 shows the relationship between the film thickness and the phase difference in the material of the antireflective layer used in examples 9 to 11. It is apparent from the diagram that the phase difference of the optically semitransmissive film can be adjusted to be a negative value by layering an antireflective layer on the phase-difference reduction layer.

FIG. 14 is a diagram showing the reflection spectrum of the surface of the photomask blank used in examples 9 to 11.

In examples 9 to 11, the transmissivity was kept within a range of 5 to 15% while keeping the phase difference near zero by using a relatively thin film, as shown in FIG. 12. The reflectivity at the exposure wavelength was a relatively low value of 30% or less, and in example 11, the reflectivity was kept to 40% or less at 266 nm, which is the photomask scanning wavelength, as shown in FIG. 14.

An MoSi-based material was used in the optically semitransmissive film in examples 9 to 11. Therefore, when a photomask with a light-blocking band was manufactured in the same manner as in examples 7 and 8, the etching selectivity of the optically semitransmissive film and the light-blocking film was high. Therefore, selective etching was possible because the optically semitransmissive film and light-blocking film both had good etching selectivity, and a good pattern shape was obtained with low dimensional error by etching the optically semitransmissive film using the light-blocking film as a mask.

In examples 9 to 11, an MoSiN antireflective layer was formed using a target composed of molybdenum and silicon as a sputtering target, but a silicon target may be used to obtain a SiN antireflective layer. Oxygen may furthermore be added to the film formation atmosphere to form an antireflective layer composed of MoSiO, SiO, MoSiON, SiON, and the like. In terms of resistance to alkali and acid washing, the molybdenum content of the antireflective layer and/or the phase-difference reduction layer is preferably less than 30%. Alternatively, the molybdenum and silicon ratio in the sputtering target is preferably set in a range of 0:100 to 30:70.

Reference Example 1

A photomask blank was fabricated using only a phase-difference reduction layer, without the use of an antireflective film (see the table in FIG. 12). As a result, the phase difference was kept to ±30° and the transmissivity was kept within a range of 5 to 15%, but the reflectivity was a very high value.

Comparative Example 3

A film composed of a material in which the refractive index n was greater than the extinction coefficient k was formed as the phase-difference reduction layer, and an antireflective layer was formed on the phase-difference reduction layer (see the table in FIG. 12). As a result, the transmissivity was kept within a range of 5 to 15% and the reflectivity was reduced, but the film had a very considerable phase difference.

The present invention is not limited to the examples described above.

Examples of a photomask blank and a photomask are described above, but the present invention may be used in all applications of an optically semitransmissive film in which a near-zero phase difference is required.

In the examples described above, the transmissivity was designed to be kept within a range of 5 to 15%, but the design value of the transmissivity can be varied in accordance with the design of the transfer pattern when the photomask is being used. The design value of the transmissivity can be selected from a range that is 40% or less, for example.

The material of the phase-difference reduction layer is furthermore not limited to the aforementioned materials, and the material may be one in which a negative phase change is produced by the transmission and/or reflection of exposure light at the boundary with the atmosphere to which the optically semitransmissive film is exposed, and/or at the boundary between the optically semitransmissive film and the translucent substrate. Specifically, the material of the phase-difference reduction layer may contain one or more materials selected from Ta, Hf, Si, Cr, Ag, Au, Cu, Al, Mo, and other materials.

When, for example, the optically semitransmissive film is used as a photomask blank, the material of the optically semitransmissive film preferably has a phase difference-reducing effect in the UV region, is resistant to alkali washing fluids and acid washing fluids, and has excellent patterning characteristics. Based on these points, it is preferable to use a material containing silicon alone or both silicon and a metal (Mo, Ta, W, Cr, Zr, Hf, or another metal). From the standpoint of photomask production, the material of the optically semitransmissive film preferably has a high etching selectivity ratio in relation to the chromium light-blocking film as a light-blocking band. For example, the dimensional precision of the translucent substrate portion can be improved by including a material that prevents the optically semitransmissive film from being etched during etching of a translucent substrate.

With an optically semitransmissive film that has, e.g., a multilayered structure comprising a phase-difference reduction layer and an antireflective layer, configuring these layers from a material that can be etched using the same etching medium is preferred from the standpoint of simplifying the mask manufacturing steps when the film is patterned.

BRIEF DESCRIPTION OF THE DRAWINGS

FIG. 10 is a table showing examples 1 to 3 of the present invention;

FIG. 12 is a table showing examples 9 to 11 of the present invention;

Figure 1A:
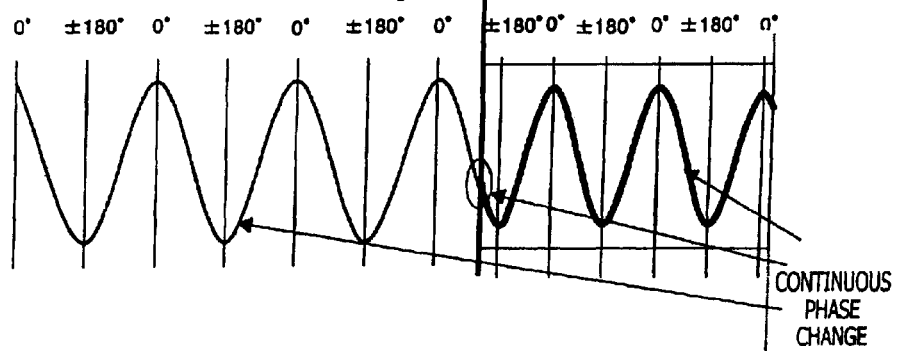
FIG. 1 is diagram schematically showing the phase change of light that advances through two media.
Figure 1B:
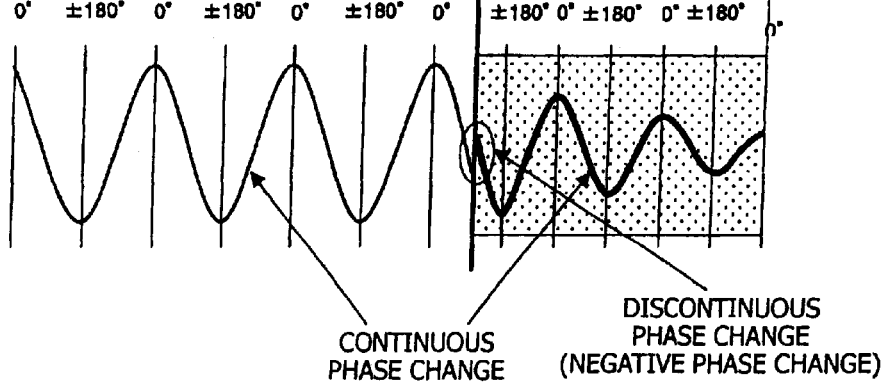
Figure 2:
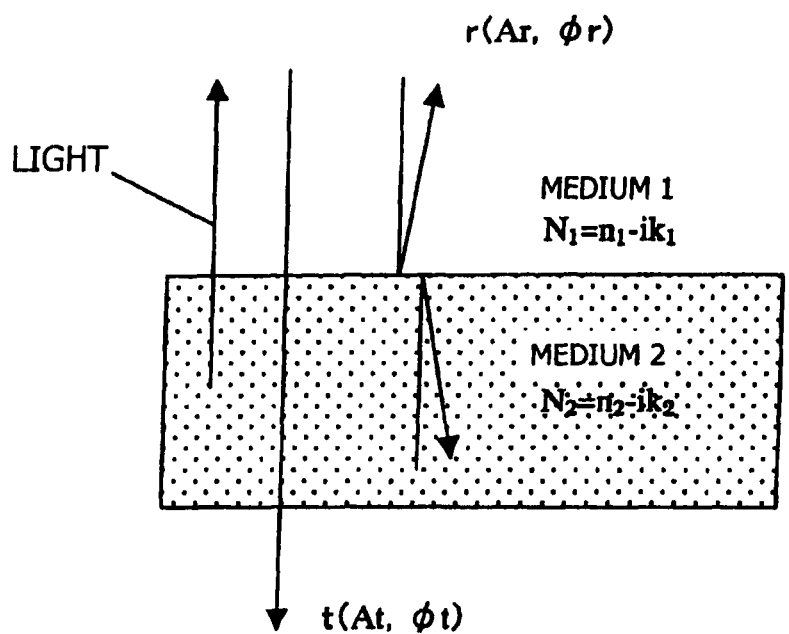
FIG. 2 is a diagram showing transmitted light and reflected light at the boundary of two media.
Figure 3:
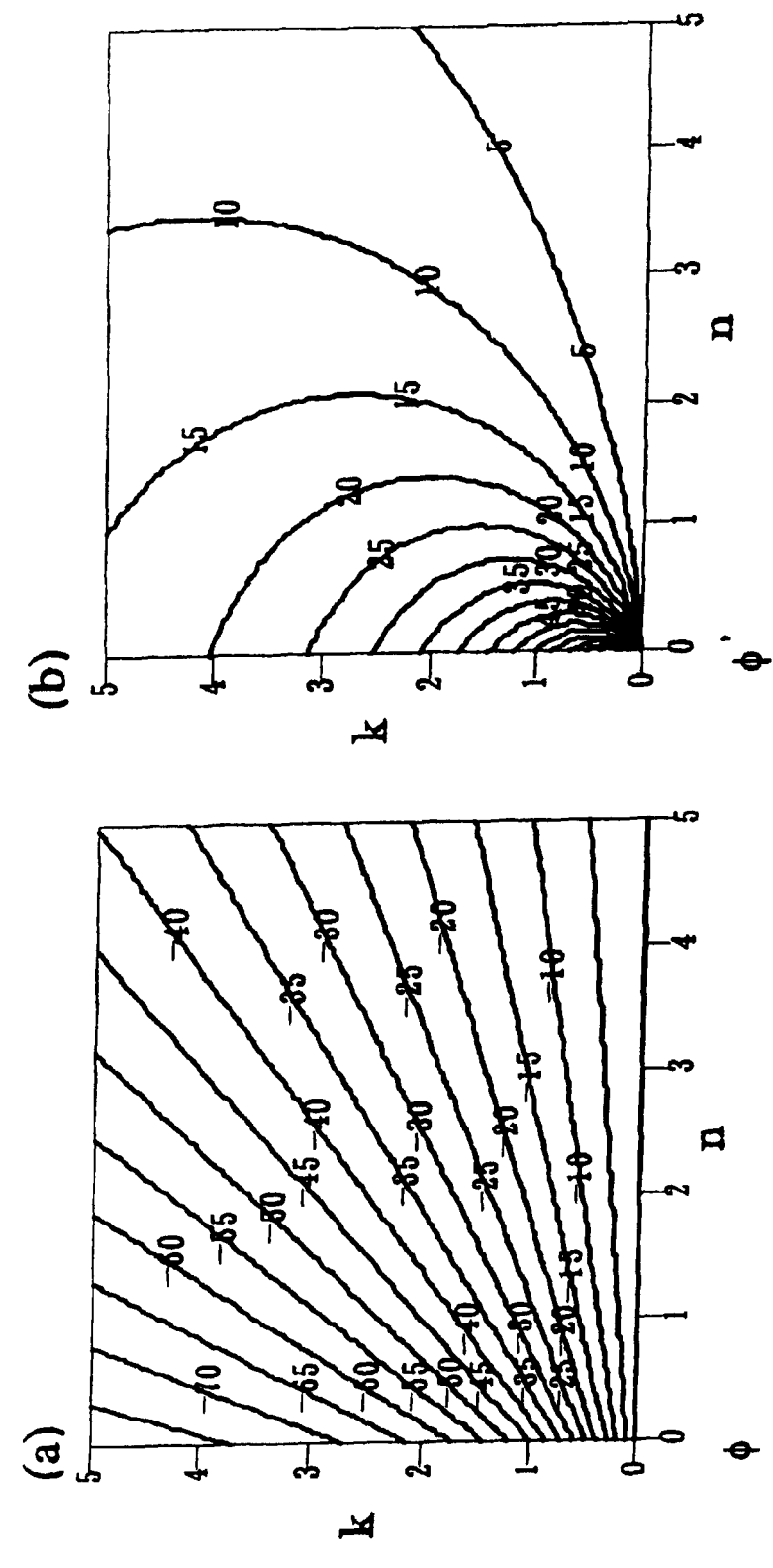
FIG. 3 is a diagram showing the phase change of light that has passed between two media.
Figure 4:
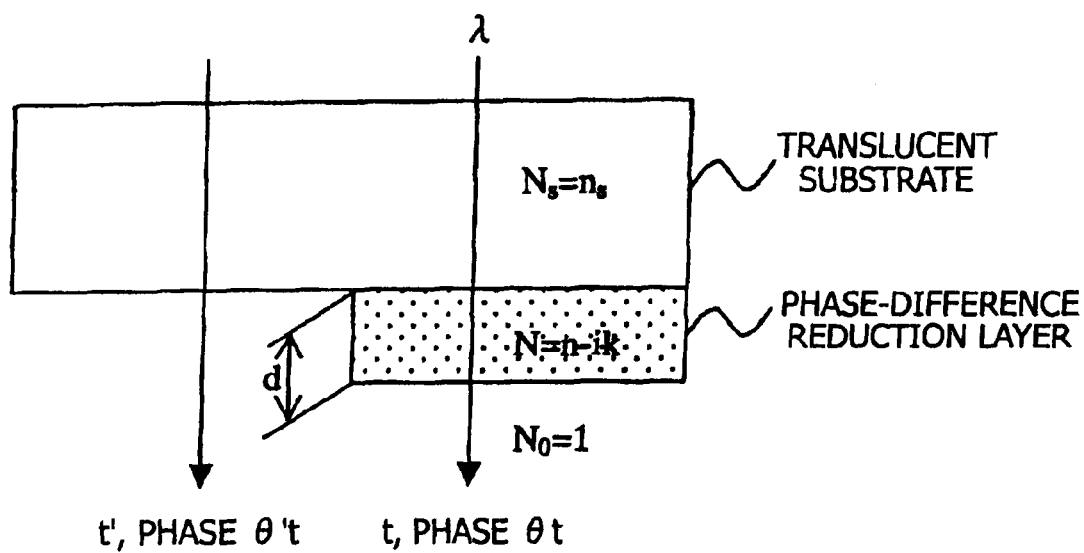
FIG. 4 is a diagram showing transmitted light and reflected light at the boundary of a translucent substrate and a phase-difference reduction layer.
Figure 5:
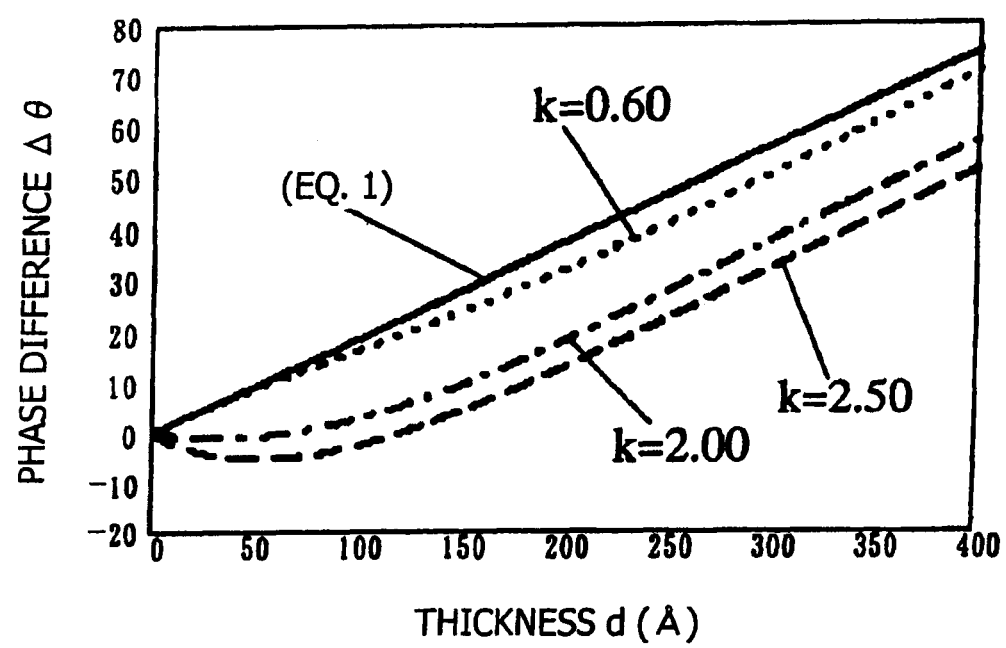
FIG. 5 is a diagram showing the relationship between the phase difference and the thickness of the film.
Figure 6:
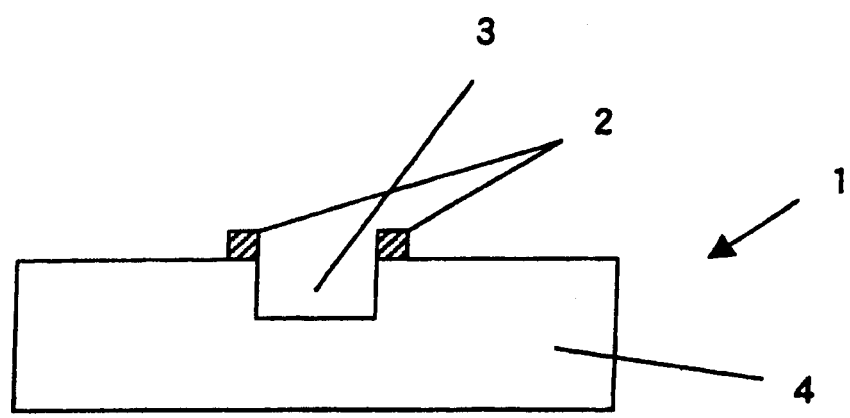
FIG. 6 is a cross-sectional view showing an embodiment of the photomask of the present invention.
Figure 7:
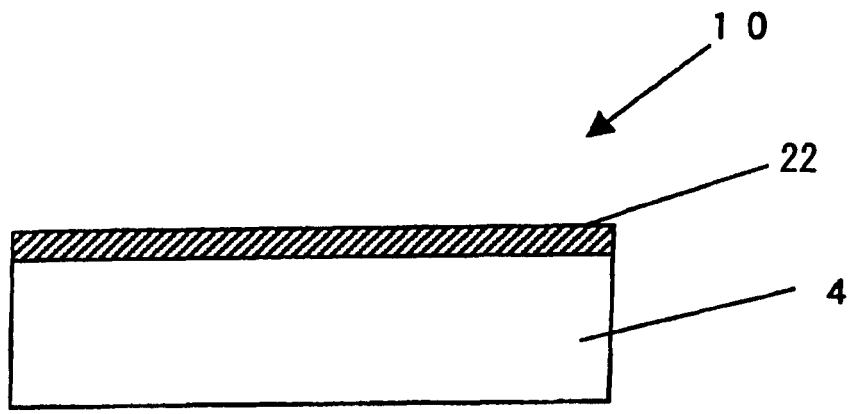
FIG. 7 is a cross-sectional diagram showing the first embodiment of the photomask blank of the present invention.
Figure 8:
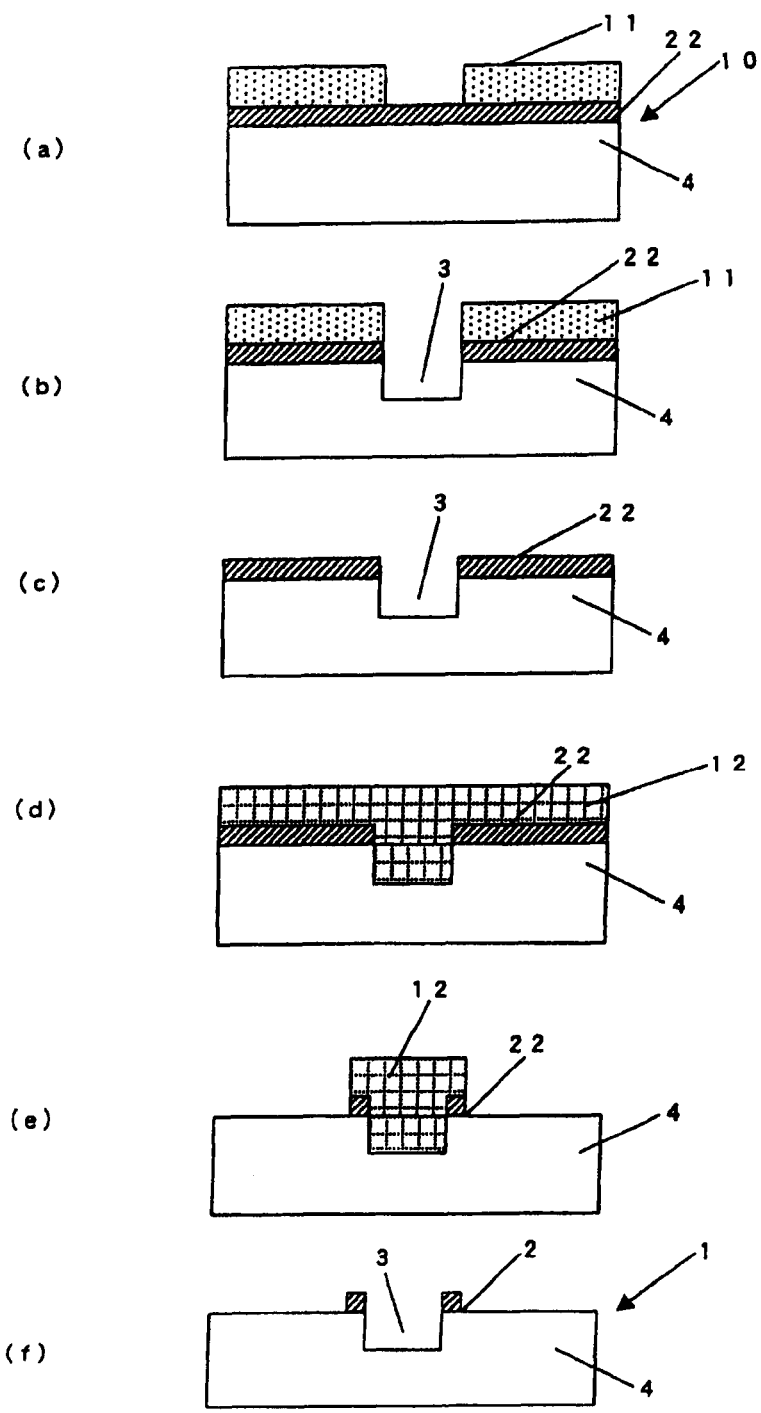
FIG. 8 is a diagram of the manufacturing steps showing the first embodiment of the method for manufacturing a photomask of the present invention.
Figure 9:
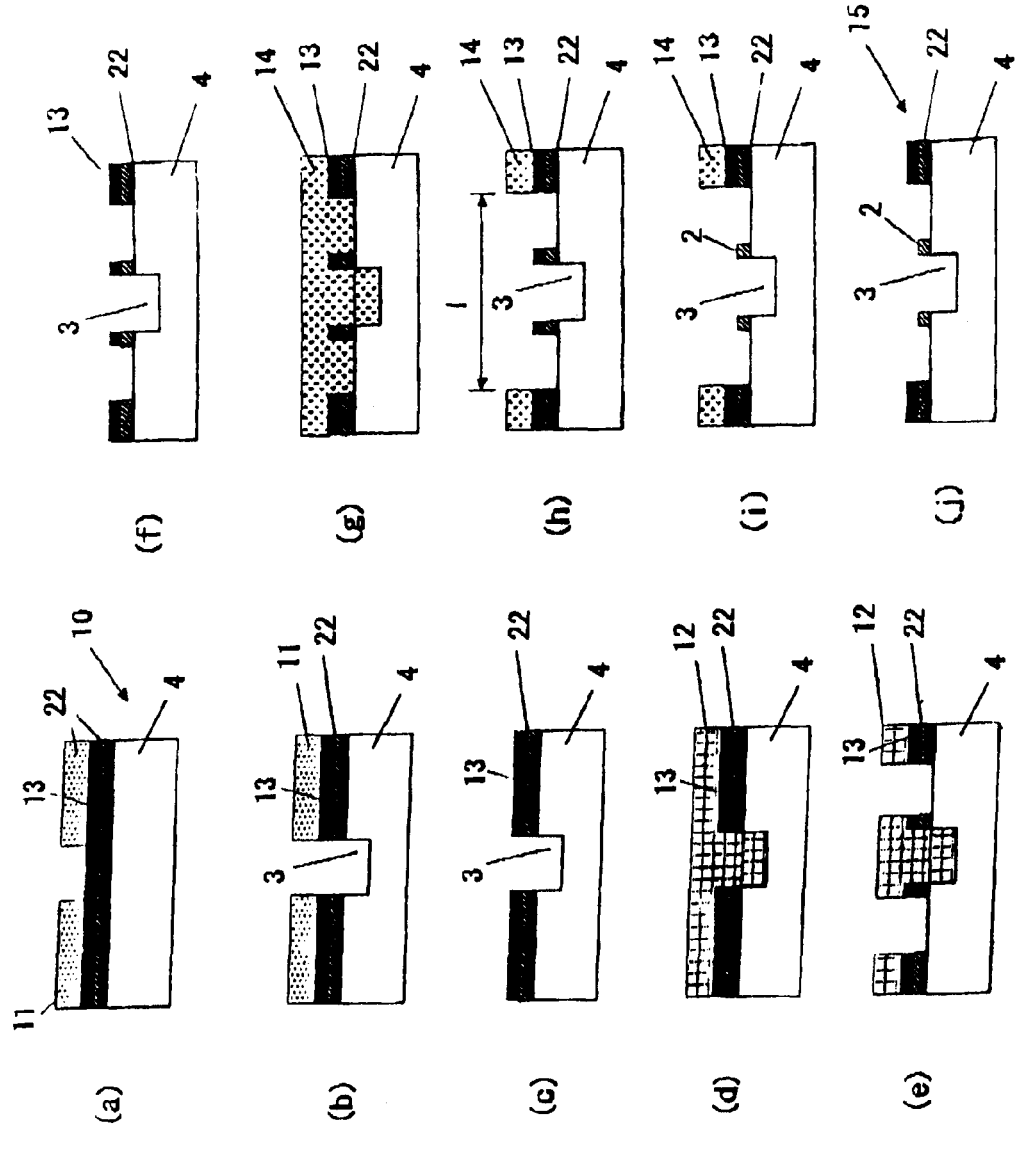
FIG. 9 is a diagram of the manufacturing steps showing another embodiment of the method for manufacturing a photomask of the present invention.
Figure 11:
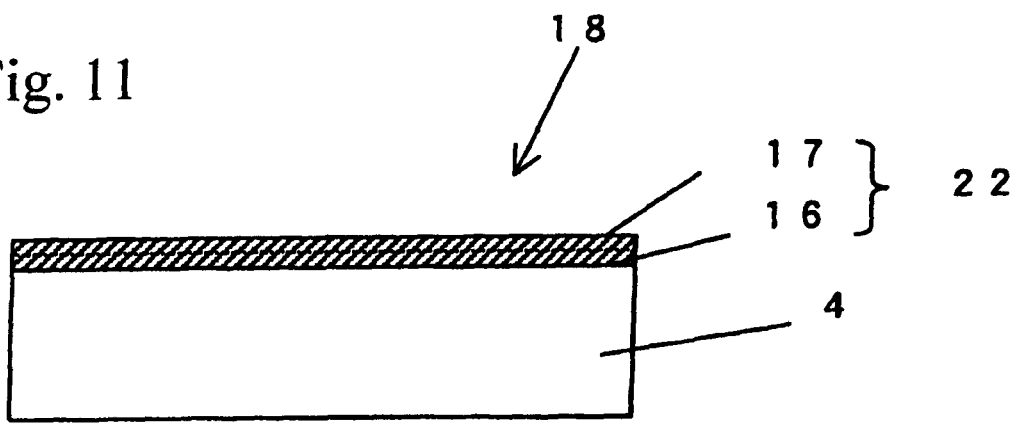
FIG. 11 is a cross-sectional view showing the photomask blank in examples 9 to 11 of the present invention.
Figure 13:
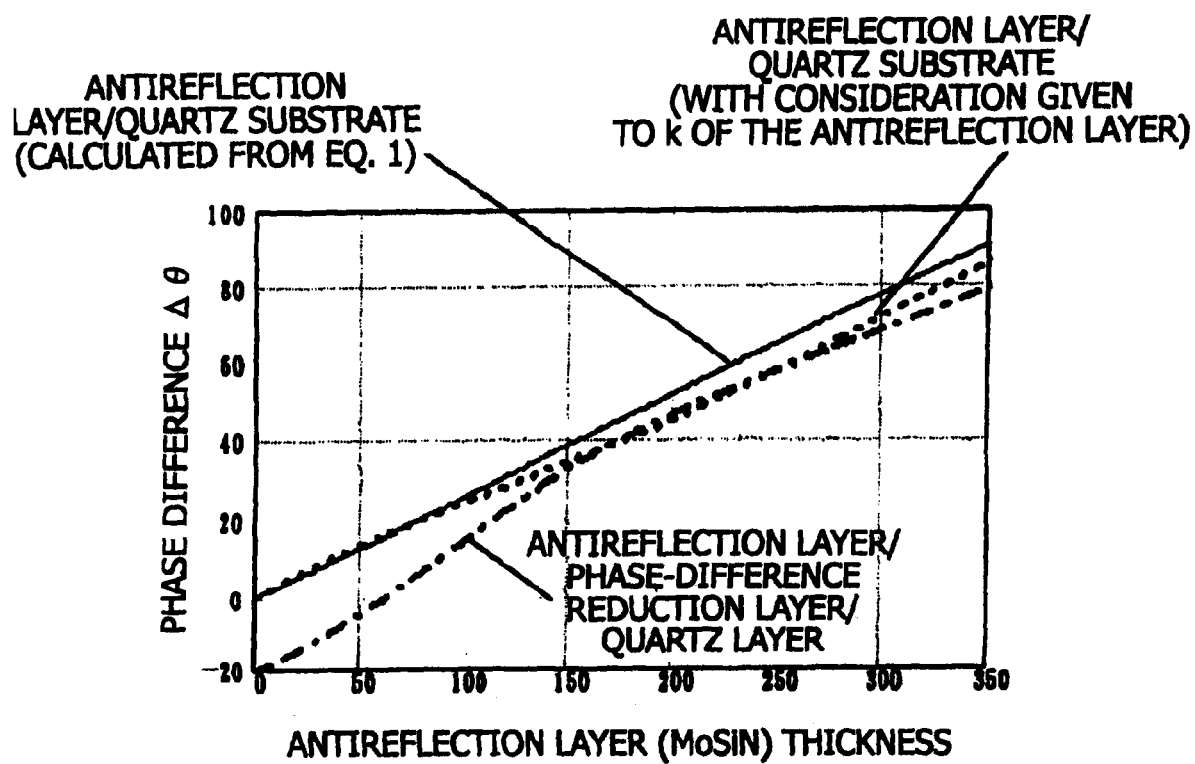
FIG. 13 is a diagram showing the relationship between the film thickness and the phase difference of the photomask blank in examples 9 to 11 of the present invention.
Figure 14:
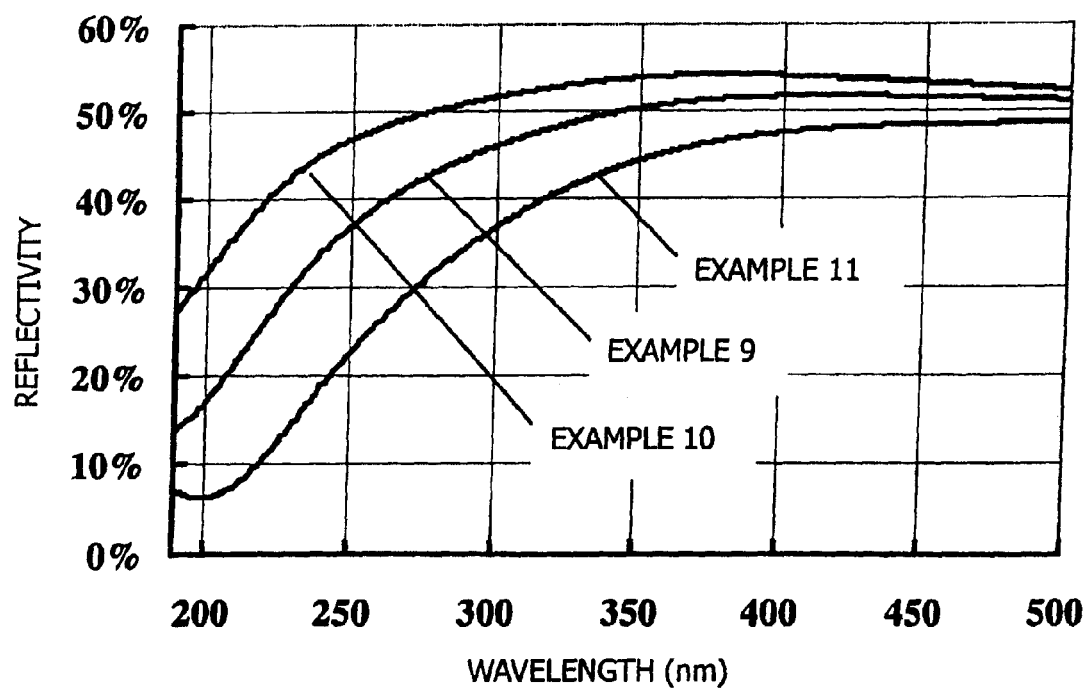
FIG. 14 is a reflection spectrum of the photomask blank in examples 9 to 11 of the present invention.

KEY 1 photomask
2 light-blocking portion
3 aperture
4 translucent substrate
10 photomask blank
11, 12, 14 resist films
13 light-blocking film
15 photomask having a light-blocking band
16 phase-difference reduction layer
17 antireflection layer
18 photomask blank
22 optically semitransmissive film
33 light-blocking film

The invention claimed is:

1. A photomask blank comprising:
a transparent substrate and
a film containing at least two layers of a first layer and a second layer formed on the transparent substrate,
wherein the first layer is comprised of a material containing one or more materials selected from a group consisting of Ta, Hf, Si, Cr, Ag, Au, Cu, Al, and Mo,
the second layer is comprised of MoSiN, MoSiO, MoSiON, SiN, SiO, or SiON, and
a phase difference of the film containing at least two layers is from −30° to +30°.

2. The photomask blank of claim 1, wherein the first layer is comprised of a material containing MoSi.

3. The photomask blank of claim 2, wherein a content of Mo in the first layer is less than 30%.

4. The photomask blank of claim 2, wherein the first layer is formed using a sputtering target in which a ratio of Mo to Si is from 0:100 to 30:70.

5. The photomask blank of claim 1, wherein the first layer is comprised of a material in which a refractive index n1 and an extinction coefficient k1 satisfy an expression $k1 \geq n1$.

6. The photomask blank of claim 1, wherein an extinction coefficient k1 of the first layer is 2.0 or more.

7. The photomask blank of claim 1, wherein an extinction coefficient k1 of the first layer is 2.5 or more.

8. The photomask blank of claim 1, wherein the second layer contains Mo, and a content of Mo in the second layer is less than 30%.

9. The photomask blank of claim 1, wherein the second layer contains Mo and Si, and is formed using a sputtering target in which a ratio of Mo to Si is from 0:100 to 30:70.

10. The photomask blank of claim 1, wherein the second layer is an antireflective layer.

11. The photomask blank of claim 10, wherein the antireflective layer is disposed on the first layer.

12. The photomask blank of claim 1, wherein a thickness of the film containing at least two layers is from 1 to 50 nm.

13. The photomask blank of claim 1, further comprising a film composed of a chromium-based material formed on the film containing at least two layers.

14. The photomask blank of claim 1, further comprising a resist film formed on the film containing at least two layers.

15. A photomask manufactured by using the photomask blank of claim 1.

* * * * *